United States Patent
Lee et al.

(10) Patent No.: US 11,940,484 B2
(45) Date of Patent: Mar. 26, 2024

(54) TEST APPARATUS FOR SEMICONDUCTOR PACKAGE

(71) Applicant: TSE CO., LTD., Chungcheongnam-do (KR)

(72) Inventors: Sol Lee, Chungcheongnam-do (KR); Min Cheol Kim, Chungcheongnam-do (KR)

(73) Assignee: TSE CO., LTD., Chungcheongnam-do (KR)

(*) Notice: Subject to any disclaimer, the term of this patent is extended or adjusted under 35 U.S.C. 154(b) by 81 days.

(21) Appl. No.: 17/892,370

(22) Filed: Aug. 22, 2022

(65) Prior Publication Data

US 2023/0065997 A1 Mar. 2, 2023

(30) Foreign Application Priority Data

Aug. 27, 2021 (KR) .................. 10-2021-0114090

(51) Int. Cl.
*G01R 31/28* (2006.01)
(52) U.S. Cl.
CPC ..... *G01R 31/2863* (2013.01); *G01R 31/2889* (2013.01)
(58) Field of Classification Search
CPC .. G01R 1/0408; G01R 1/0433; G01R 1/0483; G01R 1/07314; G01R 31/26; G01R 31/2808; G01R 31/2886
See application file for complete search history.

(56) References Cited

U.S. PATENT DOCUMENTS

| | | | |
|---|---|---|---|
| 2012/0244648 A1* | 9/2012 | Matsuhashi | G01R 1/0466 257/E21.531 |
| 2018/0277449 A1* | 9/2018 | Muto | G01R 1/0466 |

FOREIGN PATENT DOCUMENTS

| | | |
|---|---|---|
| KR | 10-2015-0106848 | 9/2015 |
| KR | 10-1555965 | 9/2015 |

* cited by examiner

*Primary Examiner* — Tung X Nguyen

(57) ABSTRACT

An apparatus for testing a package-on-package type semiconductor package includes an upper test socket on which an upper package is mounted, the upper test socket being mounted on a pusher and connected to the lower package; a lower test socket mounted on a tester and connected to the lower package; and an adsorption pad coupled to the pusher and configured to adsorb and pressurize the lower package using a vacuum pressure, wherein the adsorption pad comprises a body part having a vacuum pressure passage formed therein; and an adsorption part having an adsorption hole corresponding to the vacuum pressure passage, and the body part is attached on a central portion of an upper surface of the adsorption part and an outer oil overflow-preventing part configured to trap silicon oil eluted from the body part is formed at an outer periphery the adsorption part.

16 Claims, 4 Drawing Sheets

(a)

(b)

(a)

(b)

TEST APPARATUS FOR SEMICONDUCTOR PACKAGE

CROSS-REFERENCE TO RELATED APPLICATION

This application claims priority of Korean Patent Application No. 10-2021-0114090, filed on Aug. 27, 2021, in the KIPO (Korean Intellectual Property Office), the disclosure of which is incorporated herein entirely by reference.

BACKGROUND OF THE INVENTION

Field of the Invention

The present disclosure relates to a test apparatus for a semiconductor package, and more particularly, to a test apparatus for a semiconductor package configured to test whether normal operation of a package-on-package (POP) type semiconductor package formed by vertically stacking a lower package and an upper package.

Description of the Related Art

A semiconductor package is formed by integrating fine electronic circuits with high density, and during a manufacturing process, is subjected to a test process for determining whether each electronic circuit is normal. The test process is a process for testing whether a semiconductor package is normally operated, and, as a result, distinguishing defect-free products from defective products.

In a process for testing a semiconductor package, a test apparatus which electrically connects a terminal of the semiconductor package and a tester applying a test signal is employed. The test apparatus has various structures depending on a type of the semiconductor package to be tested.

Recently, as use of a package-on-package (POP) type semiconductor package which minimizes component size and enables signal to be rapidly transmitted has been increased, demand for the test apparatus for testing such semiconductor package has also been steadily continuing.

As illustrated in FIG. 1, a conventional test apparatus 100 for testing a pack-on-package type semiconductor package a lower test socket 40 and an upper test socket 60 for signal transmission and a pusher 50 coupled to the upper test socket. An adsorption pad 70, which is movably coupled to the pusher and receives a vacuum pressure from an external vacuum pressure generating device through the pusher, is formed on the pusher. The lower test socket 40 is installed on a tester 30 to be electrically connected to the lower package 10, and the upper package 20 is mounted on the upper test socket to be electrically connected to the upper test socket 60. In this test apparatus, in a state in which the adsorption pad 70 installed on the pusher 50 is moved downward and adsorbs the lower package 10 to be tested, by placing the lower package above the lower test socket 40 and then further moving the adsorption pad downward to pressurize the lower package 10, the second electro-conductive part 61 of the upper test socket 60 and the upper terminal 12 of the lower package 10 are connected to each other, so the tester 30, the lower test socket 40, the lower package 10, the upper test socket 60 and the upper package 20 are electrically connected to each other to conduct an electrical test.

In a conventional test apparatus for a general semiconductor package, a picker adsorbs a semiconductor package to be tested to place it on the test socket, the picker is then moved to adsorb another semiconductor package, and the pusher pressurizes a semiconductor package placed on the test socket to perform an electrical test. That is, in a conventional test apparatus for a semiconductor package, the picker and the pusher are separately operated and the picker merely adsorbs and places the semiconductor package, so the picker adsorbs the semiconductor package only for a short time.

On the other hand, in a test device for testing a package-on-package type semiconductor package, since the picker and pusher are integrally formed with each other and the adsorption pad of the picker adsorbs, loads and pressurizes a semiconductor to be tested at the same time, the adsorption pad of the picker has a structure required to make contact with the semiconductor package for a long time, and in particular, in the case of a reliability test, the contact state between the adsorption pad and the lower package is maintained for a period of 1 to 2 weeks.

In a test apparatus for testing a package-on-package type semiconductor package, the adsorption pad 70 is made of silicon to protect the semiconductor package and to increase vacuum adsorption performance, and a so-called sticky phenomenon, in which the lower semiconductor package sticks to the adsorption pad due to these characteristics of the silicon, is occurred. In order to prevent such the sticky phenomenon, conventionally, a method of applying an anti-static coating or a special coating on a surface of the adsorption pad which is in close contact with the semiconductor package has been implemented, but the sticky phenomenon has been still not improved.

In recent, as illustrated in (a) of FIG. 3, in order to prevent the sticky phenomenon from being occurred, on a lower portion of a body part 710 of the adsorption pad 70, a stiction-preventing member made of any one of a polyimide film, engineering plastic and synthetic resin is formed as an adsorption part 720.

In a test apparatus for testing a package-on-package type semiconductor package, in which the adsorption pad 70 is connected to the lower package for a long time, however, since, as depicted in (b) of FIG. 3, the body part 710 of the adsorption pad 70 is in a state of being compressed by a vacuum pressure for a long time, silicon oil is eluted from the body part made of silicon and flows down along a surface of the body part 710 and a vacuum pressure passage hole 711 as indicated by the arrow "A", and in particular, silicon oil flowing down flows into a gap between the adsorption pad and the lower semiconductor package, silicon oil is thus accumulated between the adsorption part 720 of the adsorption pad 70 and the lower semiconductor package 10 (S exemplarily represents accumulated silicon), whereby there is a problem in that the sticky phenomenon in which the adsorption pad 70 and the lower semiconductor package 10 stick to each other occurs more frequently.

SUMMARY OF THE INVENTION

The present disclosure has been devised in view of the above problems, and an object of the present disclosure is to provide a test apparatus for a semiconductor package which can precisely test a package-on-package type semiconductor package operated at a high speed.

In addition, another object of the present disclosure is to provide a test apparatus for a semiconductor package which can completely prevent a sticky phenomenon in which a semiconductor package sticks to an adsorption pad.

In order to solve the above-mentioned problems, a test apparatus for a semiconductor package configured to test a package-on-package (POP) type semiconductor package according to the present disclosure includes an upper test socket on which an upper package is mounted, the upper test socket being mounted on a pusher and connected to the lower package placed therebelow; a lower test socket mounted on a tester and connected to the lower package placed thereabove; and an adsorption pad movably coupled to the pusher and configured to adsorb and pressurize the lower package using a vacuum pressure provided through the pusher, wherein the adsorption pad includes a body part having a vacuum pressure passage formed therein, and made of a silicon material; and an adsorption part having a diameter greater than that of the body part, having an adsorption hole formed at a position corresponding to the vacuum pressure passage, and made of any one of a polyimide film, engineering plastic, and synthetic resin, and wherein the body part is attached on a central portion of an upper surface of the adsorption part and an outer oil overflow-preventing part configured to trap silicon oil eluted from the body part may be formed at an outer periphery the adsorption part.

The adsorption hole may have a diameter smaller than that of the vacuum pressure passage, and an inner oil overflow-preventing part surrounding the adsorption hole may be formed on an inner periphery of the upper surface of the adsorption part.

The outer or inner oil overflow-preventing part may have a wall shape.

The outer or inner oil overflow-preventing part may be formed of any one material of silicon, polyimide film, engineering plastic and synthetic resin.

A thickness of the outer or inner oil overflow-preventing part may be smaller than that of the adsorption part.

In addition, the outer or inner oil overflow-preventing part may have a concaved groove shape formed by etching away a portion of the adsorption part.

Also, the upper test socket may include a plurality of electro-conductive parts, each electro-conductive part having a configuration in which a plurality of electro-conductive particles is in an elastic insulating material.

The electro-conductive part may be supported by an inelastic insulating pad made of an inelastic insulating material.

The test apparatus for a semiconductor package according to the present disclosure is advantageous in that the adsorption part of the adsorption pad that adsorbs the lower package is made of a stiction-preventing material and the oil overflow-preventing part that blocks silicon oil eluted from the body part is additionally formed along the outer or inner periphery of the adsorption part, the sticky phenomenon in which the teste lower package sticks to the adsorption pad is thus almost completely prevented.

In addition, the test apparatus for a semiconductor package according to the present disclosure is advantageous in that, even when the package-on-package type semiconductor package is tested, a semiconductor package does not stick to the adsorption pad, the tested semiconductor package can be thus easily placed on a loading device after a test is completed, thereby performing efficiently the entire test process.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
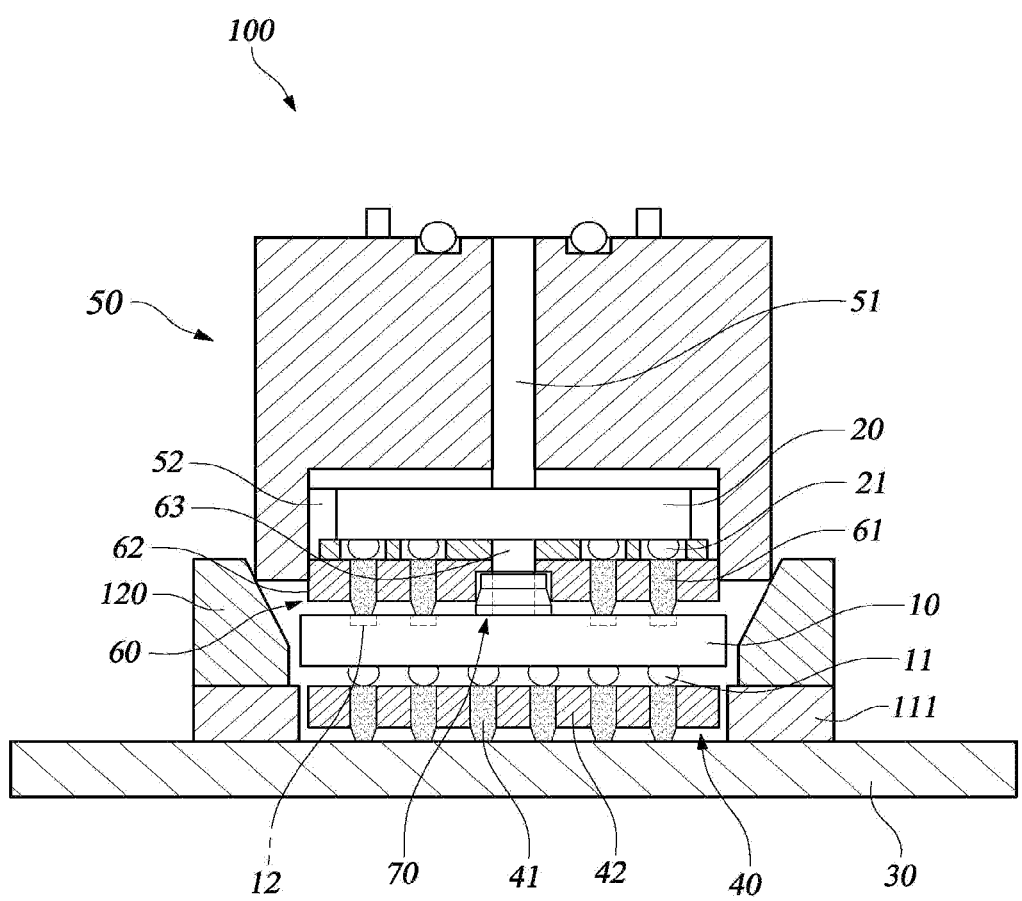
FIG. 1 is a view schematically illustrating a test apparatus for a package-on-package type semiconductor package.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Figure 2:
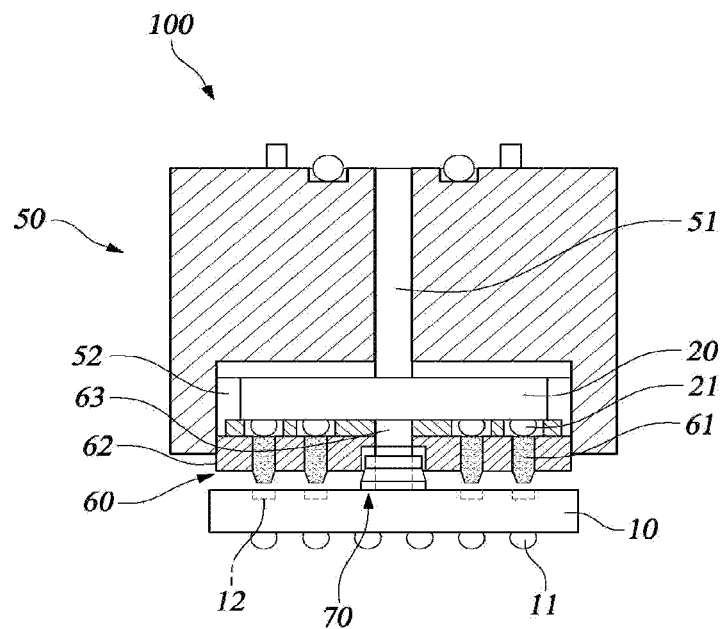
FIG. 2 is a view explaining an operation of the test apparatus for a package-on-package type semiconductor package.
Figure 2:
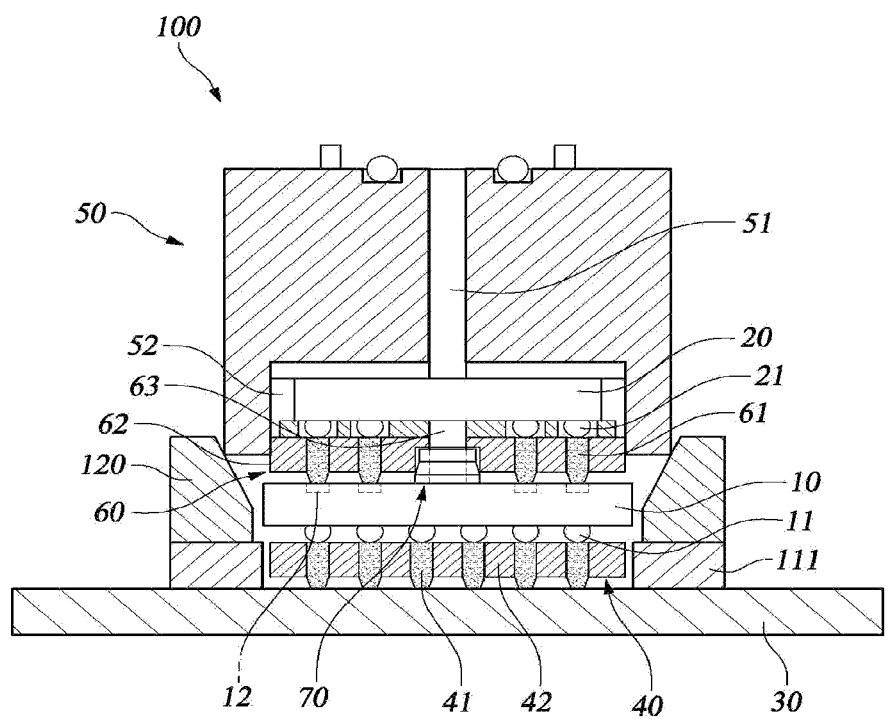
Figure 3:
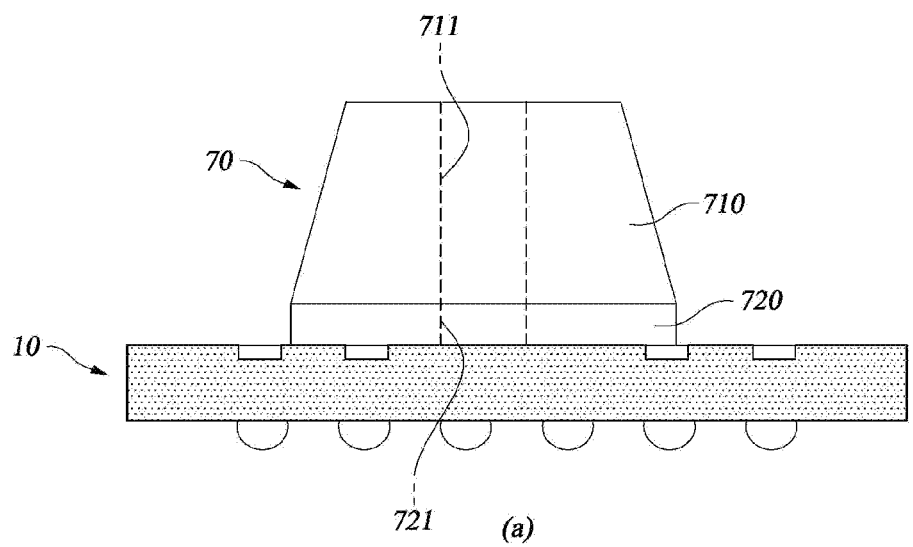
FIG. 3 is a view illustrating a state in which silicon is eluted from an adsorption pad in the test apparatus for a package-on-package type semiconductor package, thereby occurring a sticky phenomenon.
Figure 3:
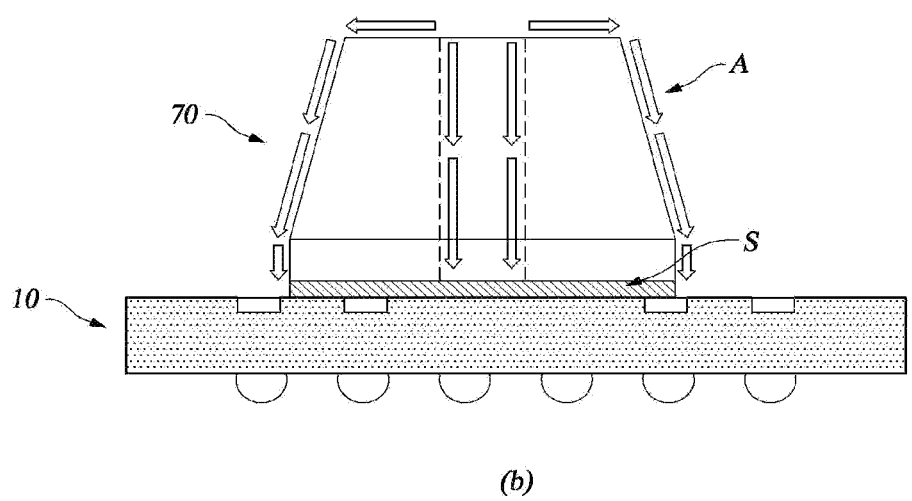
Figure 4:
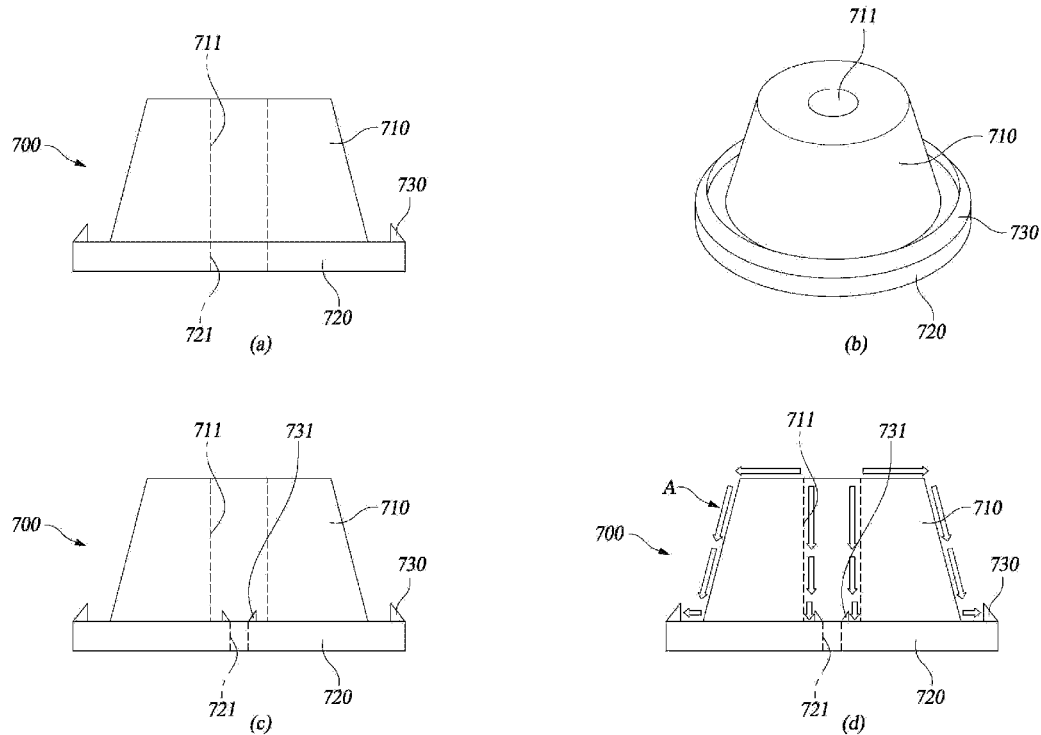
FIG. 4 is a view illustrating an adsorption pad on which an oil outflow-preventing part according to one embodiment of the present disclosure for blocking oil from outflowing is formed.
Figure 5:
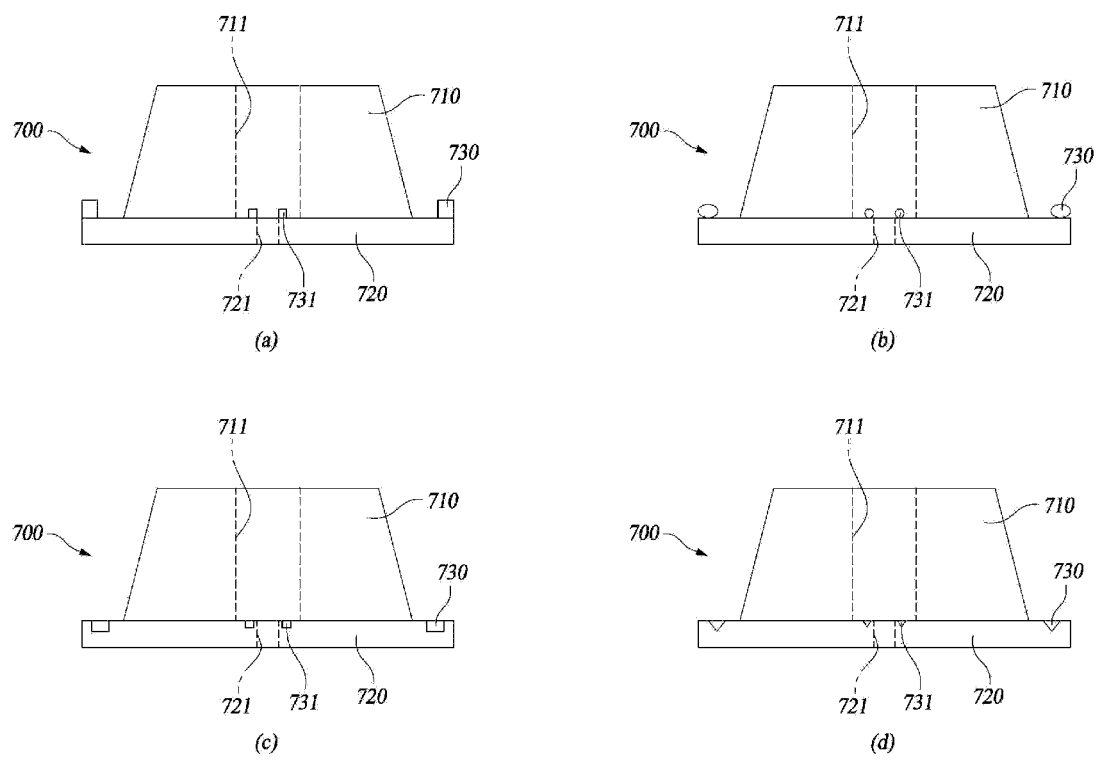
FIG. 5 is a view illustrating various modifications of the adsorption pad on which the oil outflow-preventing part according to one embodiment of the present disclosure is formed.

FIG. 1 is a view schematically illustrating a test apparatus for a package-on-package type semiconductor package, FIG. 2 is a view explaining an operation of the test apparatus for a package-on-package type semiconductor package, FIG. 3 is a view illustrating a state in which silicon is eluted from an adsorption pad in the test apparatus for a package-on-package type semiconductor package, thereby occurring a sticky phenomenon, FIG. 4 is a view illustrating an adsorption pad on which an oil outflow-preventing part according to one embodiment of the present disclosure for blocking oil from outflowing is formed, and FIG. 5 is a view illustrating various modifications of the adsorption pad on which the oil outflow-preventing part according to one embodiment of the present disclosure is formed.

As illustrated in FIG. 1, a test apparatus 100 for a package-on-package (POP) type semiconductor package according to one embodiment of the present disclosure is an apparatus for testing a lower package 10 of a package-on-package (POP) type semiconductor package using an upper package 20 pre-selected as a defect-free product, and this apparatus may electrically mediate a tester 30 generating a test signal and the package-on-package (POP) type semiconductor package.

The test apparatus 100 for a semiconductor package includes a lower test socket 40 mounted to the tester 30, a socket housing 111 and a guide housing 120 to which the lower test socket 40, a pusher 50 on which the upper test socket 60 is mounted, the pusher being configured to be movable by receiving a driving force from a driving unit (not shown); an upper test socket 60 coupled to the pusher 50, and an adsorption pad 70 movably coupled to the pusher 60 so as to adsorb the lower package 10.

The lower test socket 40 is mounted on the tester 30 to electrically connect the tester 30 and the lower package 10 positioned above the tester. The lower test socket 40 is disposed in the socket housing 111 and includes a first electro-conductive part 41 and an insulating part 42.

The first electro-conductive part 41 may have a configuration in which a plurality of electro-conductive particles is arranged in an elastic insulating material or may be a pogo pin in which a spring is received.

The pusher 50 is configured to be approached to or away from the lower test socket 40 by receive a driving force from a driving unit. The pusher 50 includes a chamber 52 formed therein to be capable of receiving the upper package 20 and a vacuum pressure passage 51 formed therein to transmit a vacuum pressure. The vacuum pressure passage 51 may be connected to an external vacuum pressure generating device (not shown) to transmit a vacuum pressure generated in the vacuum pressure generating device to the adsorption pad 70.

The upper test socket 60 is coupled to one side of the pusher 50 to seal the chamber 52. The upper package 20 (which may be a pre-selected defect-free package) placed in the chamber 52 is mounted on the upper test socket 60, and the upper test socket is electrically connected to the lower package 10 placed therebelow when a test is performed. The upper test socket 60 includes an insulating pad 62 covering the chamber 52, and a plurality of second electro-conductive parts 61 supported by the insulating pad 62.

The insulating pad 62 may be made of an inelastic insulating material. The insulating pad 62 made of an inelastic insulating material is advantageous for pressurizing the lower package 10 towards the lower test socket 40 when the upper test socket 60 is connected to the lower package 10. When the insulating pad 62 made of an inelastic insulating material stably pressurizes the lower package 10, a lower terminal 11 of the lower package 10 may be stably connected to the first electro-conductive part 41 of the lower test socket 40. As the above inelastic insulating material, polyimide, engineering plastic or various other inelastic insulating material may be utilized.

The insulating pad 62 is provided with an insulating pad hole 63. The insulating pad hole 63 is communicated with the vacuum pressure passage 51 of the chamber 52 so as to enable a vacuum pressure in the chamber 52 to be transmitted. The second electro-conductive portion 61 is formed to pass through the insulating pad 62 in a thickness direction and is supported by the inelastic insulating pad 62. The second electro-conductive part 61 may be formed to have a configuration in which a plurality of electro-conductive particles is included in an elastic insulating material.

A vacuum pressure or a release pressure is transmitted to the adsorption pad 70 through the vacuum pressure passage 51, the chamber 52, and the insulating pad hole 63 by an operation of the vacuum pressure generating device. The adsorption pad 70 is moved downward while maintaining a vacuum state to adsorb the lower package 10 to be tested, and is further moved downward to pressurize the lower package 10 or release the vacuum state, so the lower package 10 that has been tested may be placed on a loading device (not shown).

FIG. 2 is a view for explaining an operation of the test apparatus for a package-on-package type semiconductor package.

As shown in (a) of FIG. 2, the pusher 50 is moved by the driving unit and the adsorption pad 70 is moved downward to adsorb the lower package 10, and then the adsorption pad 70 transports the adsorbed lower package 10 over the lower test socket 40 and dispose it such that the lower terminal 11 of the lower package 10 comes in contact with the first electro-conductive part 41 of the lower test socket 40.

Thereafter, as shown in (b) of FIG. 2, when the pusher 50 is moved toward the lower test socket 40, the adsorption pad 70 is further moved downward to pressurize the lower package 10, so the lower terminal 11 of the lower package 10 and the first electro-conductive part 41 of the lower test socket 40 are connected to each other, and the second electro-conductive part 61 of the upper test socket 60 is connected to an upper terminal 12 of the lower package 10 by a movement of the pusher 50. At this time, as a pressurizing force of the pusher 50 is transmitted to the lower package 10 through the upper test socket 60, the tester 30, the lower test socket 40, the lower package 10, the upper test socket 60 and the upper package 20 are electrically connected to each other. In this state, a test signal generated from the tester 30 is transmitted to the lower package 10 and the upper package 20, so an electrical test for checking whether the lower package 10 is normally operated and whether the lower package 10 is properly matched to the upper package 20 can be performed.

After the test is completed, the adsorption pad 70 of the vacuum picker is moved upward, and the lower package 10 adsorbed to the adsorption pad 70 may be unloaded from the lower test socket 40 according to a movement of the pusher 50 to be transferred to a loading device (not shown).

As described above, in the test apparatus, which is used for a package-on-package (POP) type semiconductor package and tests the upper package and the lower package, in addition to adsorbing and placing the semiconductor package, the adsorption pad 70 pressurizes the semiconductor package to the silicon rubber socket, and thus has a structure required to make contact with the lower semiconductor package for a long time. In particular, in the case of the reliability test, as the adsorption pad comes into contact with the lower package for a period of 1 to 2 weeks, a sticky phenomenon in which the semiconductor package sticks to the adsorption pad 70 due to silicon oil eluted from the adsorption pad 70 occurs, so there is a problem that the semiconductor package which was tested is not properly placed on the loading device. The present inventors have invented the adsorption pad 700 of the present disclosure to solve the above problem.

FIG. 4 is a view illustrating the adsorption pad on which an oil outflow-preventing part according to one embodiment of the present disclosure for blocking oil from outflowing is formed, and FIG. 5 is a view illustrating various modifications of the adsorption pad on which the oil outflow-preventing part according to one embodiment of the present disclosure is formed. The adsorption pad according to the present disclosure is denoted by the reference numeral 700.

As illustrated in the drawings, the adsorption pad 700 according to one embodiment of the present disclosure includes a body part 710 provided with a vacuum pressure passage 711 and formed of a silicon material, and an adsorption part 720 having a diameter greater than that of the body part 710, provided with an adsorption hole 721 formed on a location corresponding to the vacuum pressure passage 711, and formed of any one of a polyimide film, engineering plastic and synthetic resin. Here, the body part 710 is attached to a central portion of an upper surface of the adsorption part 720, and an outer oil overflow-preventing part 730 for trapping silicon oil S eluted from the body part 710 may be formed on an outer periphery of the adsorption part 720.

The body part 710 constitutes the body of the adsorption pad 700, and has the vacuum pressure passage 711 formed in and passing through a central portion thereof. The vacuum pressure or release pressure provided by an operation of the vacuum pressure generating device is transmitted to the vacuum pressure passage 711 through the vacuum pressure passage 51 of the pusher, the chamber 52, and the insulating pad hole 63. Such the body part 710 is made of silicon material in order to increase a vacuum adsorption performance.

The adsorption part 720 is formed on a portion which comes in direct contact with the semiconductor package, and may be made of a hard stiction-preventing material such as a polyimide film, engineering plastic, synthetic resin, or the like. Accordingly, since a portion of the adsorption pad 700 which is in close contact with the semiconductor package is made of a stiction-preventing material, the semiconductor package may be prevented from sticking to the adsorption pad 700 to some extent.

The adsorption part 720 has the adsorption hole 721 formed at a position corresponding to the vacuum pressure passage 711 of the body part 710. The semiconductor package is adsorbed by the vacuum pressure transmitted through the adsorption hole 721 communicated with the vacuum pressure passage 711.

The adsorption part 720 has a diameter larger than that of the body part 710, the body part 710 is attached to a central portion of the upper surface of the adsorption part 720, and an outer oil overflow-preventing part 730 which traps silicon oil eluted from an outer side of the body part 710 is formed on an outer periphery of the upper surface of the adsorption part 720 to which the body part 710 is not attached.

The body part 710 is formed of a silicon material, and when the semiconductor package is adsorbed and pressurized, a vacuum pressure is transmitted to the body part 710 of the adsorption pad 700, so the body part is in a compressed state, and in this compressed state, due to a property of a silicon material, silicon oil is inevitably eluted.

Moreover, when the adsorption pad 700 is in a pressurized state while adsorbing and pressurizing the semiconductor package for a long time as in the test apparatus for a package-on-package type semiconductor package, although the amount of silicon oil eluted from the body part 710 of the adsorption pad 700 is increased, in the present disclosure, since the outer oil overflow-preventing part 730 which is capable of trapping silicon oil is formed on an outer periphery of the adsorption part 720, it is possible to solve the problem that silicon oil flows to a lower surface of the adsorption part 720 and the semiconductor package is thus adhered to the adsorption pad 700, whereby the semiconductor package which was tested is not unloaded.

In addition, as shown in (c) of FIG. 4, the adsorption hole 721 is formed to have a diameter smaller than that of the vacuum pressure passage 711, so as to allow a portion of the upper surface of the adsorption part 720 to be left on a boundary between the adsorption hole 721 and the vacuum pressure passage 711, and an inner oil overflow-preventing part 731 surrounding the adsorption hole may be formed on an inner periphery of the upper surface of the remained adsorption part.

The inner oil overflow-preventing part 731 performs a function of trapping silicon oil eluted along an inner side of the body part 710, that is, the vacuum pressure passage ole 711.

The outer oil overflow-preventing part 730 and the inner oil overflow-preventing part 731 are formed along an outer edge and an inner edge of the upper surface of the adsorption part 720, respectively, and have a configuration capable of trapping silicon oil eluted from the outer side and the inner side of the body part 710.

The outer oil overflow-preventing part 730 or the inner oil overflow-preventing part 731 may be formed in a wall shape. The wall shaped oil overflow-preventing part may have a triangular cross-section as shown in (a) and (c) of FIG. 4, a rectangular cross-section as shown in (a) of FIG. 5, or a circular cross-section as shown in (b) of FIG. 5, and may have various another cross-section. (b) of FIG. 4 is a perspective view of the adsorption pad shown in (a) of FIG. 4.

In addition, it is preferable that a thickness of each of the outer oil overflow-preventing part 730 and the inner oil overflow-preventing part 731 is smaller than that of the adsorption part 720.

In addition, the outer oil overflow-preventing part 730 or the inner oil overflow-preventing part 731 may be made of any one of silicon, polyimide film, engineering plastic, or synthetic resin. Since the outer oil overflow-preventing part 730 or the inner oil overflow-preventing part 731 is not a part which is pressurized by vacuum pressure, silicon oil is not eluted. Therefore, silicon may be employed as a material for the outer oil overflow-preventing part 730 or the inner oil overflow-preventing part 731.

In addition, the outer oil overflow-preventing part 730 and the inner oil overflow-preventing part 731 may be formed to have a concaved groove shape formed by etching away a part of the adsorption part 720. The concaved groove shape may have a rectangular cross-section as shown in c of FIG. 5, a triangular cross-section as shown in (d) of FIG. 5 and various another cross-section. The concaved groove shape may be obtained by etching away a part of the adsorption part with a laser or a cutting tool.

(d) of FIG. 4 shows that the outer oil overflow-preventing part 730 and the inner oil overflow-preventing part 731 are formed on the adsorption pad 700 according to one embodiment of the present disclosure to prevent silicon oil eluted from the body part 710 from flowing out of the adsorption part 720. In the drawings, "A" represents a flow of silicon oil.

Silicon oil eluted from the outer side of the body part 710 of the adsorption pad 700 is blocked by the outer oil overflow-preventing part 730, and silicon oil eluted from the inner side of the body part 710 is blocked by the inner oil overflow-preventing part 731.

In the test apparatus used for a package-on-package (POP) type semiconductor package and testing the upper package and the lower package, since the test apparatus has the structure in which, in addition to adsorbing and loading the semiconductor package, the adsorption pad 70 serves to pressurize the semiconductor package to a silicon rubber test socket and pressurizes the semiconductor package for a long time when a test is performed, even if the adsorption pad 700 includes the body part 710 made of an elastic material such as silicon and the adsorption part 720 formed as a stiction-preventing member and attached to a lower end of the body part 710, a sticky phenomenon in which silicone oil is eluted from the body part 710 of the adsorption pad 700, eluted silicon oil is collected at a lower end of the adsorption part 720, and the semiconductor package thus sticks to the adsorption part 720 of the adsorption pad 700 may be occurred. In the present disclosure, however, since the oil overflow-preventing part capable of blocking silicon oil eluting from the body part 710 of the adsorption pad 700 is additionally formed, it is possible to completely prevent a sticky phenomenon in which the semiconductor package sticks to the adsorption pad 700 from being occurred.

As described above, the test apparatus 100 for a semiconductor package according to one embodiment of the present disclosure is advantageous in that the adsorption part 720 of the adsorption pad 700 that adsorbs the lower package 10 is made of a stiction-preventing material and the oil overflow-preventing part that blocks silicon oil eluted from the body part 710 is additionally formed along the outer or inner periphery of the adsorption part 720, the sticky phenomenon in which the teste lower package 10 sticks to the adsorption pad 700 is thus almost completely prevented.

In addition, the test apparatus 100 for a semiconductor package according to one embodiment of the present disclosure is advantageous in that, even when the package-on-package type semiconductor package is tested, a semiconductor package does not stick to the adsorption pad, the tested semiconductor package can be thus easily placed on a loading device after a test is completed, thereby performing efficiently the entire test process.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. An apparatus for a semiconductor package, configured to test a package-on-package type semiconductor package, comprising:
   an upper test socket on which an upper package is mounted, the upper test socket being mounted on a pusher and connected to a lower package placed therebelow;
   a lower test socket mounted on a tester and connected to the lower package placed thereabove; and
   an adsorption pad movably coupled to the pusher and configured to adsorb and pressurize the lower package using a vacuum pressure provided through the pusher, wherein the adsorption pad comprising:
   a body part having a vacuum pressure passage formed therein, and made of a silicon material; and
   an adsorption part having a diameter greater than that of the body part, having an adsorption hole formed at a position corresponding to the vacuum pressure passage, and made of any one of a polyimide film, engineering plastic, and synthetic resin,
   wherein the body part is attached on a central portion of an upper surface of the adsorption part and an outer oil overflow-preventing part configured to trap silicon oil eluted from the body part is formed at an outer periphery the adsorption part.

2. The test apparatus of claim 1, wherein the adsorption hole has a diameter smaller than that of the vacuum pressure passage, and an inner oil overflow-preventing part surrounding the adsorption hole is formed on an inner periphery of the upper surface of the adsorption part.

3. The test apparatus of claim 1, wherein the outer or inner oil overflow-preventing part has a wall shape.

4. The test apparatus of claim 2, wherein the outer or inner oil overflow-preventing part has a wall shape.

5. The test apparatus of claim 3, wherein the outer or inner oil overflow-preventing part is formed of any one material of silicon, polyimide film, engineering plastic, and synthetic resin.

6. The test apparatus of claim 4, wherein the outer or inner oil overflow-preventing part is formed of any one material of silicon, polyimide film, engineering plastic, and synthetic resin.

7. The test apparatus of claim 1, wherein the outer or inner oil overflow-preventing part has a concaved groove shape formed by etching away a portion of the adsorption part.

8. The test apparatus of claim 2, wherein the outer or inner oil overflow-preventing part has a concaved groove shape formed by etching away a portion of the adsorption part.

9. The test apparatus of claim 1, wherein the upper test socket comprises a plurality of electro-conductive parts, each electro-conductive part having a configuration in which a plurality of electro-conductive particles is in an elastic insulating material.

10. The test apparatus of claim 9, wherein the electro-conductive part is supported by an inelastic insulating pad made of an inelastic insulating material.

11. An apparatus for a semiconductor package, configured to test a package-on-package type semiconductor package, comprising:
- an upper test socket on which an upper package is mounted, the upper test socket being mounted on a pusher and connected to a lower package placed therebelow;
- a lower test socket mounted on a tester and connected to the lower package placed thereabove; and
- an adsorption pad movably coupled to the pusher and configured to adsorb and pressurize the lower package using a vacuum pressure provided through the pusher, wherein the adsorption pad comprising:
- a body part having a vacuum pressure passage formed therein; and
- an adsorption part having a diameter greater than that of the body part, having an adsorption hole formed at a position corresponding to the vacuum pressure passage.

12. The test apparatus of claim 11, wherein the adsorption hole has a diameter smaller than that of the vacuum pressure passage.

13. The test apparatus of claim 11, wherein the upper test socket comprises a plurality of electro-conductive parts, each electro-conductive part having a configuration in which a plurality of electro-conductive particles is in an elastic insulating material.

14. The test apparatus of claim 13, wherein the electro-conductive part is supported by an inelastic insulating pad made of an inelastic insulating material.

15. The test apparatus of claim 3, wherein a thickness of the outer or inner oil overflow-preventing part may be smaller than that of the adsorption part.

16. The test apparatus of claim 4, wherein a thickness of the outer or inner oil overflow-preventing part may be smaller than that of the adsorption part.

* * * * *